US012803589B2

(12) United States Patent
Duchrau et al.

(10) Patent No.: US 12,803,589 B2
(45) Date of Patent: Nov. 17, 2026

(54) AREA OPTIMIZED MODIFIED CROSS PARITY CODE FOR FAST ERROR CORRECTION AND DETECTION

(71) Applicant: Infineon Technologies AG, Neubiberg (DE)

(72) Inventors: Georg Duchrau, Preddöhl (DE); Klaus Oberländer, Neubiberg (DE); Thiyagu Loganathan, Baldham (DE); Michael Goessel, Mahlow (DE)

(73) Assignee: Infineon Technologies AG, Neubiberg (DE)

( * ) Notice: Subject to any disclaimer, the term of this patent is extended or adjusted under 35 U.S.C. 154(b) by 319 days.

(21) Appl. No.: 18/391,963

(22) Filed: Dec. 21, 2023

(65) Prior Publication Data

US 2025/0211252 A1 Jun. 26, 2025

(51) Int. Cl.
*H03M 13/11* (2006.01)

(52) U.S. Cl.
CPC .................................. *H03M 13/11* (2013.01)

(58) Field of Classification Search
CPC .................................................... H03M 13/11
See application file for complete search history.

(56) References Cited

U.S. PATENT DOCUMENTS 6,282,686 B1 * 8/2001 Cypher ............... G06F 11/1028 714/766
2014/0229786 A1 * 8/2014 Poolakkaparambil ...................... G06F 11/1402 714/746
2015/0089333 A1 * 3/2015 Hosp .................... H03M 13/19 714/807

* cited by examiner

*Primary Examiner* — Mark D Featherstone
*Assistant Examiner* — Rong Tang
(74) *Attorney, Agent, or Firm* — Eschweiler & Potashnik, LLC

(57) ABSTRACT

A solution is directed to determining an error in k data bits comprising the steps: determining the error, in particular the position of the error, based on M check bits and on n check bits; wherein the k data bits are arranged according to a structure; wherein the structure comprises the M check bits, wherein the M check bits are calculated based on the k data bits; wherein the structure comprises n groups, n being larger or equal to two, wherein each of the k data bits is associated with one of the n groups and wherein each of the n groups is associated with one of the n check bits.

20 Claims, 4 Drawing Sheets

AREA OPTIMIZED MODIFIED CROSS PARITY CODE FOR FAST ERROR CORRECTION AND DETECTION

Embodiments of the present invention relate to an efficient approach to determine and/or correct errors in data bits.

A cross parity code (see, e.g., [Duchrau, G., Gössel, M. (2023). Modified Cross Parity Codes for Adjacent Double Error Correction. In: Goumas, G., Tomforde, S., Brehm, J., Wildermann, S., Pionteck, T. (eds) Architecture of Computing Systems. ARCS 2023. Lecture Notes in Computer Science, vol 13949. Springer, Cham.]) utilizes data bits that are arranged in a quadratic array with a row parity for every row, a column parity for every column and an overall parity for all data bits. Each parity is represented by a single bit. Each row parity is determined as a modulo 2 sum of this row's data bits and each column parity is determined as a modulo 2 sum of this column's data bits. Finally, the overall parity is determined as a modulo 2 sum of all data bits.

The square array comprises M columns and M rows, i.e., $M^2$ data bits. The cross parity code provides 2M+1 check bits, i.e., the aforementioned column parities, row parities and the overall parity.

A single bit error in one of the data bits allows determining the position of the error as it affects a row parity and a column parity. Correcting the single bit error can be achieved by flipping the data bit at the identified position.

It is an objective to provide a different approach for detecting and/or correcting errors in data bits.

The examples suggested herein may be based on at least one of the following solutions. In particular combinations of the following features could be utilized in order to reach a desired result. The features of the method could be combined with any feature(s) of the device, computer program product or vice versa.

A method is provided for determining an error in k data bits comprising the steps:

- determining the error, in particular the position of the error, based on M check bits and on n check bits;
- wherein the k data bits are arranged according to a structure;
- wherein the structure comprises the M check bits, wherein the M check bits are calculated based on the k data bits;
- wherein the structure comprises n groups, n being larger or equal to two, wherein
  - each of the k data bits is associated with one of the n groups;
  - each of the n groups is associated with one of the n check bits.

It is noted that the k data bits may comprise any sort of bits, payload, filling bits, constants or the like. Insofar, the term "data bits" is used merely to be differentiated from the term "check bits". Hence, there is a first type of bits, which can be used for any kind of information, i.e., the data bits, and a second type of bits, i.e., the check bits, which are determined based on the data bits.

Thus, the error is determined based on a number of M+n check bits. It is noted that the M check bits are a first type of check bits that are part of the structure, e.g., along a diagonal of an array (or matrix), and the n check bits are a second type of check bits that may be stored separate to the structure. One of the n check bits is determined for each of the n groups.

The k data bits are distributed across the structure, wherein a single data bit of the k data bits is associated with only one of n groups of the structure.

It is noted that the structure may be a functional structure, i.e., it may utilize memory cells that could be spread across a physical memory in various ways. The functional structure allows for some representation of the memory cells that enables utilizing the above mentioned effect, i.e., separating the structure into n groups, defining n check bits for the n groups and M check bits, which are different from the n check bits, but also dependent on the structure and are also determined based on the k data bits. In other words, "arranged according to a structure" does not limit the placement of memory cell pursuant to any physical structure (or memory), but instead enables the features of the functional structure as described herein.

According to an embodiment, the M check bits are used to partition the structure into the n groups.

According to an embodiment, the structure is an array, in particular an array with M lines and M columns, and the M check bits are arranged on a diagonal of the array that divides the array into two groups.

According to an embodiment, each of the M check bits is determined based on an XOR operation or an XNOR operation of the data bits of the column and line associated with this particular M check bit.

According to an embodiment, the structure comprises $$k = M^2 - M$$

data bits.

According to an embodiment, n=2 and two groups of the n check bits each comprises $$\frac{M^2 - M}{2}$$

check bits.

According to an embodiment, each of the n check bits is determined based on an XOR operation or an XNOR operation of the k/n data bits of its group.

According to an embodiment, the error is corrected by inverting the erroneous data bit.

Also, a device is provided for determining an error in k data bits, the device comprising at least one processing unit that is configured to conduct the steps of the method as described herein.

Such processing unit can comprise at least one, in particular several means that are arranged to execute the steps of the method described herein. The means may be logically or physically separated; in particular several logically separate means could be combined in at least one physical unit. Said processing unit may comprise at least one of the following: a processor, a microcontroller, a hard-wired circuit, an ASIC, an FPGA, a logic device.

Further, a device for error correction is suggested, comprising:

- a first circuit configured to determine a structure and n check bits based on k data bits, wherein the structure comprises M check bits, which M check bits are configured to separate the structure into n groups, wherein each of the M check bits is calculated based on a portion of the data bits and wherein each of the n check bits is calculated based on the data bits of the respective group, wherein the first circuit is further configured to output the structure and the n check bits, a memory coupled to the first circuit and configured to store the structure and the n check bits, a second circuit coupled to the memory and configured to read at least one structure and the n check bits associated with this structure from the memory, a third circuit coupled to the second circuit and configured to determine an error in the k data bits based on the structure and the n check bits read from the memory, and the third circuit is further configured to conduct an error correction by inverting the data bit for which an error has been determined.

According to an embodiment, the second circuit and the third circuit are combined into a single circuit.

According to an embodiment, the first circuit, the second circuit and optionally the third circuit are combined as a single circuit.

According to an embodiment, the structure is a square array and the M check bits are located along the diagonal of the square array separating the structure into n=2 groups.

Also, a computer program product is provided that is directly loadable into a memory of a digital processing device, comprising software code portions for performing the steps of the method as described herein.

Embodiments are shown and illustrated with reference to the drawings. The drawings serve to illustrate the basic principle, so that only aspects necessary for understanding the basic principle are illustrated. The drawings are not to scale. In the drawings the same reference characters denote like features.

Figure 1:
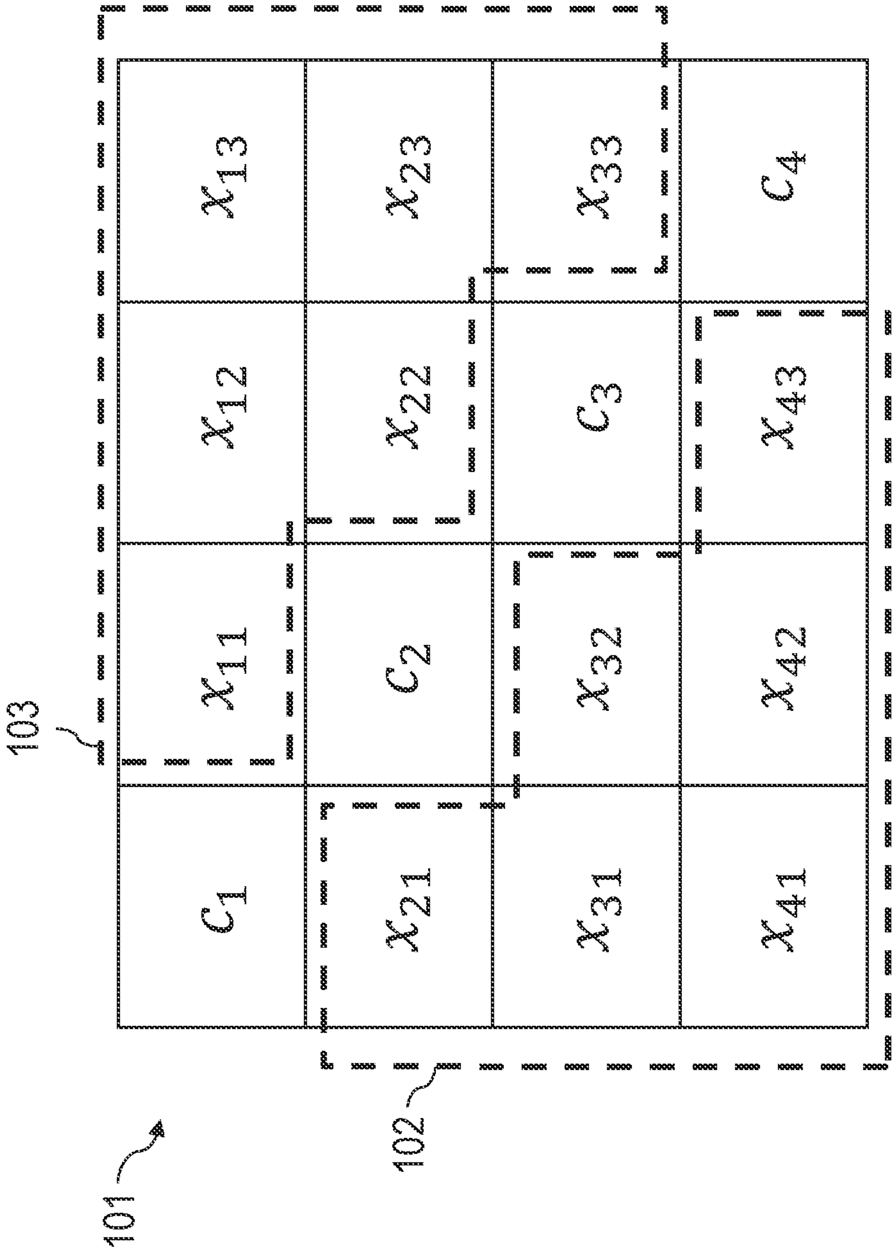
FIG. 1 shows an M×M array as an exemplary structure, wherein the array comprises M check bits along its diagonal.

FIG. 1 shows an exemplary array 101 comprising M columns and M rows (with M=4) resulting in $M^2$ fields. Along the diagonal of the M×M array 101, M=4 check bits $c_1$, $c_2$, $c_3$, $c_4$ are located. The remaining fields of the array 101 are filled with data bits $x_{11}$, $x_{12}$, $x_{13}$, $x_{21}$, $x_{22}$, $x_{23}$, $x_{31}$, $x_{32}$, $x_{33}$, $x_{41}$, $x_{42}$ and $x_{43}$.

Hence, the square array 101 has $M^2$ fields, M check bits and $$k = M^2 - M$$

data bits.

The M check bits $c_i$ (i=1, . . . , M) are part of the array 101 and separate the k data bits into n=2 different groups 102, 103.

Each of the check bits $c_i$ (i=1, . . . , M) is determined based on the data bits, e.g., as follows:

$$c_1 = x_{11} + x_{12} + x_{13} + x_{21} + x_{31} + x_{41}$$

$$c_2 = x_{21} + x_{22} + x_{23} + x_{11} + x_{32} + x_{42}$$

$$c_3 = x_{31} + x_{32} + x_{33} + x_{12} + x_{22} + x_{43}$$

$$c_4 = x_{41} + x_{42} + x_{43} + x_{13} + x_{23} + x_{33}$$

Hence, each of the check bits $c_i$ (i=1, . . . , M) is determined based on the data bits that are arranged in the same column and the same row as this particular check bit.

In addition, two check bits $p_1$, $p_2$ are determined based on the data bits of the different groups, i.e.

$$p_1 = x_{11} + x_{12} + x_{13} + x_{22} + x_{23} + x_{33}$$

$$p_2 = x_{21} + x_{31} + x_{32} + x_{41} + x_{42} + x_{43}$$

In other words, one check bit $p_i$ is determined for each of the n different groups, by adding the data bits that are located in each of the n groups.

It is noted that each of the addition is a XOR (exclusive or) operation or an XNOR (exclusive not or) operation. As each of the data bits are either 0 or 1, the following applies in case of the XOR operation: 0+0-0, 0+1=1+0=1, 1+1=0.

If a position of a single bit error is detected, this error can be corrected by flipping the bit (either from 1 to 0 or from 0 to 1). This can be done by conducting an XOR operation of the error bit with 1 (if the error bit is 0, the corrected bit will be 1 and vice versa).

As an example, a single bit error may occur that falsifies the data bit $x_{22}$ into $x_{22}'$. This affects (i.e., changes) the check bits $c_2$, $c_3$ and $p_2$.

Based on the erroneous check bits $c_2$ and $c_3$ alone, the error could also have affected data bit $x_{32}$. However, the falsified data bit $x_{22}'$ also inverts check bit $p_2$ (but not check bit $p_1$). As $p_1$ is the check bit for the group in which data bit $x_{22}'$ is located, it can be concluded that the faulty data bit has to be data bit $x_{22}'$ and data bit $x_{32}$ is correct. The correction of the falsified data bit $x_{22}'$ is as follows:

$$x_{22} = x'_{22} + 1.$$

Figure 2:
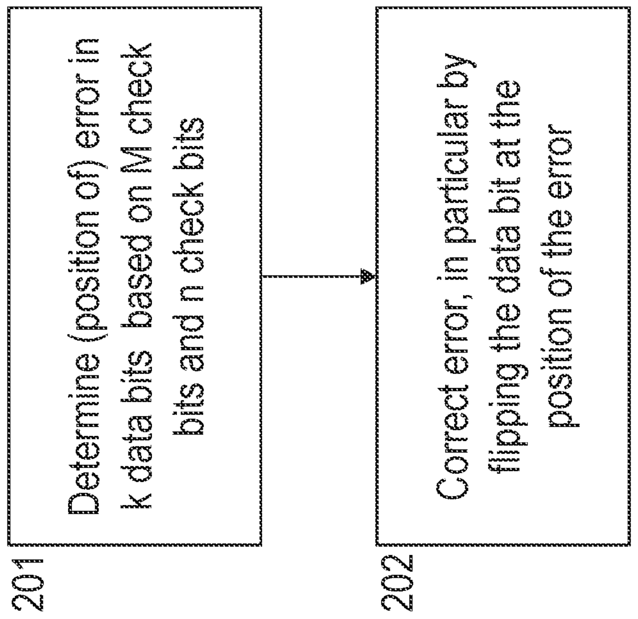
FIG. 2 shows exemplary steps of a method for correcting an error in k data bits.

FIG. 2 shows a flow chart with steps to be performed by a method that allows determining an error (and/or a position of said error) in k data bits. In step 201, the error is determined based on M check bits and n check bits. The k data bits and the M check bits are arranged according to a structure, e.g., located in an array. The M check bits are used to separate the structure into n groups. The M check bits are calculated based on the k data bits. It is noted that "calculated based on the k data bits" also refers to a calculation based on a portion of the k data bits. For example, each of the M check bits can be calculated by adding (via an XOR operation) data bits of the same row and column of the array. An XNOR operation could be used instead of the XOR operation.

For each of the n groups an additional (extra) check bit is provided, which can be calculated by adding the data bits of each group. Hence, in total a number of M+n check bits are used to detect the error, to determine the position of the error and to correct the error. The correction can be done by flipping (inverting) the incorrect bit.

Burst Errors

A burst error is an error that may in particular affect a number of consecutive bits. This may be detrimental if several check bits are affected by the same burst error. In order to mitigate this issue, it is suggested that the order of the data bits within the structure, e.g., the aforementioned array, is re-arranged to avoid that previously consecutive data bits are "close" to each other in the structure.

Figure 3:
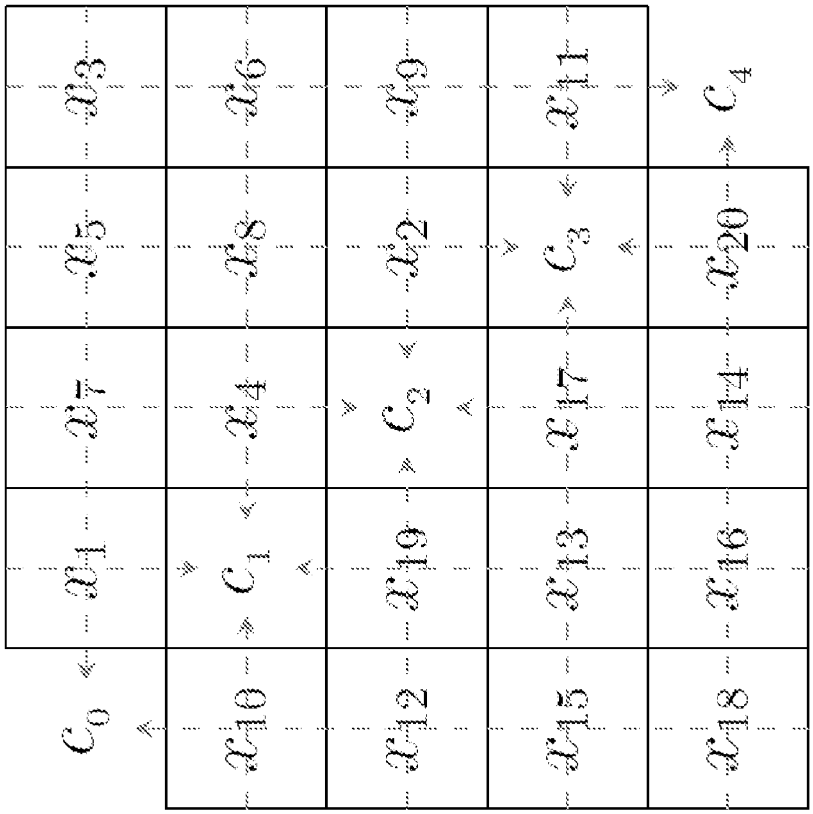
FIG. 3 shows a 5×5 array comprising a scrambled order of (originally) subsequent data bits in order to mitigate the detrimental effect of burst errors.

An array with an exemplary mapping to mitigate handling burst errors is suggested in FIG. 3, which shows a square array with $M^2=5^2=25$ fields and 5 check bits $c_i$ (i=1, . . . , 5) that are located along the diagonal of the array. The array comprises 25−5=20 data fields. A succession of k data bits $x_1, x_2, \ldots, x_{20}$ is re-sorted as shown in FIG. 3. Hence, instead of filling consecutive data bits line after line (or column after column) into the available fields of the array, a different mapping is used so that adjacent data bits (e.g., $x_2$, $x_3$) are located in fields of the array that affect different check bits. For example, the data bits $x_2$ and $x_3$, if filled into the first row of the array, would both affect check bit $c_0$. According to the mapping shown in FIG. 3, data bit $x_2$ affects check bits $c_2$, $c_3$ and data bit $x_3$ affects check bits $c_0$ and $c_4$. This allows detecting a burst error in the data bits $x_2$, $x_3$, which would otherwise (if filled into the first row) not be possible (as two errors in the first row cancel each other out and would thus not flip the check bit $c_0$).

Exemplary Device

Figure 4:
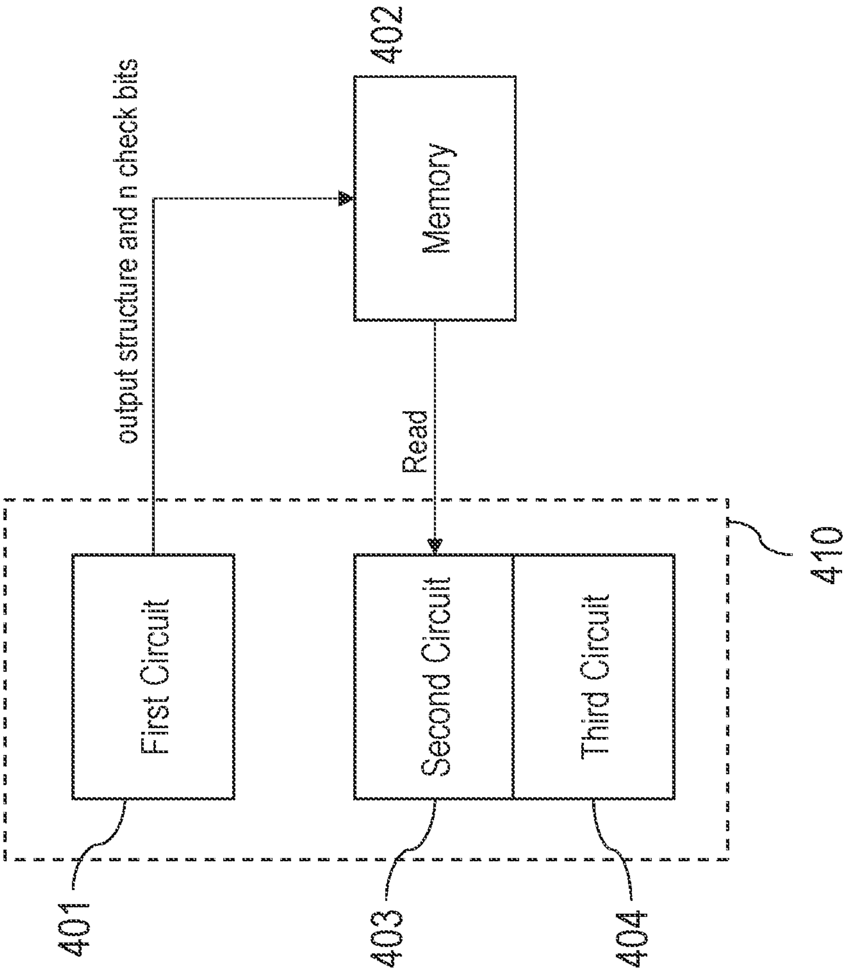
FIG. 4 shows a block diagram of circuits that interact with a memory to enable error detection and correction.

FIG. 4 shows an exemplary device that can be used for correcting errors as described herein. A first circuit 401, e.g., a processing unit that prepares and conducts write operations, outputs a structure and n check bits towards a memory 402.

For example, the first circuit 401 may receive a stream of data bits, which is separated into chunks of k data bits. For each chunk of k data bits, a structure (e.g., square array with $M^2$ fields) is determined with a diagonal of M check bits. Each of the M check bits is calculated based on the data bits of the column and the row identified by this particular check bit. Further, the M check bits along the diagonal of the square array separate the array into n=2 groups. For each group, an additional check bit $p_1$, $p_2$ is calculated based on the data bits of the respective group. Hence, in this example, the first circuit outputs the square array comprising $k=M^2-M$ data bits and M check bits together with n=2 (separate) check bits $p_1$, $p_2$ to be stored in the memory 402.

It is noted that a large amount of data bits can be separated into chunks of k data bits and processed as described, i.e., for each chunk a structure with M check bits and n separate check bits is compiled and stored in the memory 402. It is further noted that if a chuck of data bit comprises less than k data bits, filling bits can be used (which could be predetermined bits or a coded sequence of bits indicating an end of the data bits).

A second circuit 403, e.g., a processing unit that conducts read operations on the memory 402, reads the structure and the n check bits from the memory 402.

A third circuit 404 could serve as an error detection and/or correction unit, which determines, based on the structure and the n check bits associated with this structure, whether or not (at least) one of the k data bits associated with the structure is incorrect. This can be determined based on the M check bits that are part of the structure and the additional n check bits that are separate to the structure as described above. If an error is determined, it can be corrected by inverting the erroneous data bit.

It is noted that any combination of the first circuit, second circuit and/or third circuit could be combined as a single circuit. It is another option that the memory is implemented together with any combination of these circuits.

FURTHER EMBODIMENTS AND ADDITIONAL ASPECTS

In one or more examples, the functions described herein may be implemented at least partially in hardware, such as specific hardware components or a processor. More generally, the techniques may be implemented in hardware, processors, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium, i.e., a computer-readable transmission medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

Instructions may be executed by one or more processors, such as one or more central processing units (CPU), digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a single hardware unit or provided by a collection of interoperative hardware units, including one or more processors as described above, in conjunction with suitable software and/or firmware.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

The invention claimed is:

1. A method for determining an error in k data bits comprising:
- arranging the k data bits into an array having M rows and M columns and M check bits disposed along a diagonal of the array;
- storing the array in a memory;
- for each of the M check bits, calculating a value for the check bit as a sum of data bits in a row and data bits in a column in which the check bit is disposed;
- wherein the diagonal of the array that includes the M check bits divides the array into two groups, such that each of the k data bits is associated with one of the two groups;
- calculating two additional check bits by adding data bits in a first of the two groups to generate a first additional check bit and adding data bits in a second of the two groups to generate a second additional check bit;
- identifying a position of an erroneous data bit in the array based on two erroneous check bits and one erroneous additional check bit; and
- correcting, by changing a bit value stored in the memory, the erroneous data bit in the identified position.

2. The method according to claim 1, comprising calculating each of the M check bits based on an XOR operation or an XNOR operation of the data bits of the column and the data bits of the row associated with the check bit.

3. The method according to claim 1, wherein the array comprises $$k = M^2 - M$$

data bits.

4. The method according to claim 1, wherein each of the two groups comprises $$\frac{M^2 - M}{2}$$

data bits.

5. The method according to claim 1, comprising calculating each additional check bit by performing determined based on an XOR operation or an XNOR operation of the data bits of its group.

6. The method according to claim 1, comprising correcting the erroneous data bit by inverting the erroneous data bit.

7. The method according to claim 1, further comprising
- reading the k data bits from memory in a consecutive order;
- re-arranging the order of the k data bits; and
- populating the array with the k data bits according to the re-arranged order of the k data bits.

8. A device for error correction, comprising:
- a memory;
- a first circuit coupled to the memory and comprising
  - a processing unit configured to
    - receive a stream of k data bits;
    - arrange the k data bits into an array having M rows and M columns and M check bits disposed along a diagonal of the array, wherein the diagonal of the array that includes the M check bits divides the array into two groups, such that each of the k data bits is associated with one of the two groups;
  - a first hardware circuit that, for each of the M check bits, inputs data bits in a row and a column in which the check bit is disposed, performs an XOR or XNOR operation on the input bits, and outputs a value for the check bit;
  - a second hardware circuit that, for each of the two groups, inputs data bits in the group, performs an XOR or XNOR operation on the input data bits, and outputs an additional check bit value; and
  - the processing unit configured to store the array and the two additional check bits in the memory,
- a second circuit coupled to the memory and configured to read the array and the two additional check bits from the memory,
- a third circuit coupled to the second circuit, comprising
  - a third hardware circuit that for each of the M check bits in the array, inputs data bits in a row and a column in which the check bit is disposed, performs an XOR or XNOR operation on the input bits, and outputs a second value for the check bit;
  - a fourth hardware circuit that, for each of the two groups, inputs data bits in the group, performs an XOR or XNOR operation on the input data bits, and outputs a second additional check bit value;
  - wherein the third circuit is configured to identify a position of an erroneous data bit in the array based on two erroneous check bits and one erroneous additional check bit, wherein each of the two erroneous check bits comprises a second check bit value that does not match the corresponding check bit value stored in the memory and the one erroneous additional check bit comprises a second additional check bit value that does not match the corresponding additional check bit value stored in the memory; and correct the erroneous data bit in the identified position.

9. The device according to claim 8, wherein the second circuit and the third circuit are combined into a single circuit.

10. The device according to claim 8, wherein the first circuit and the second circuit are combined as a single circuit.

11. The device according to claim 8, wherein the array comprises $$k = M^2 - M$$

data bits.

12. The device according to claim 8, wherein each of the two groups comprises $$\frac{M^2 - M}{2}$$

data bits.

13. The device according to claim 8, wherein the erroneous data bit is corrected by inverting the erroneous data bit.

14. The device according to claim 8, wherein the first circuit is configured to receive the k data bits in a consecutive order;

re-arrange the order of the k data bits; and populate the array with the k data bits according to the re-arranged order of the k data bits.

15. Non-transitory computer-readable medium storing computer-executable instructions that, when executed by a processor, cause the processor to perform operations, the operations comprising:

arranging k data bits into an array having M rows and M columns and M check bits disposed along a diagonal of the array, storing the array in a memory;

for each of the M check bits, calculating a value for the check bit as a sum of data bits in a row and data bits in a column in which the check bit is disposed;

wherein the diagonal of the array that includes the M check bits divides the array into two groups, such that each of the k data bits is associated with one of the two groups;

calculating two additional check bits by adding data bits in a first of the two groups to generate a first additional check bit and adding data bits in a second of the two groups to generate a second additional check bit;

identifying a position of an erroneous data bit in the array based on two erroneous check bits and one erroneous additional check bit; and correcting, by changing a bit value stored in the memory, the erroneous data bit in the identified position.

16. The non-transitory computer-readable medium according to claim 15, wherein the operations comprise calculating each of the M check bits based on an XOR operation or an XNOR operation of the data bits of the column and the data bits of the row associated with the check bit.

17. The non-transitory computer-readable medium according to claim 15, wherein the array comprises $$k = M^2 - M$$

data bits.

18. The non-transitory computer-readable medium according to claim 15, wherein the operations comprise calculating each additional check bit based on an XOR operation or an XNOR operation of the data bits of its group.

19. The non-transitory computer-readable medium according to claim 15, wherein the operations comprise correcting the erroneous data bit by inverting the erroneous data bit.

20. The non-transitory computer-readable medium according to claim 15, the operations further comprising reading the k data bits in a consecutive order;

re-arranging the order of the k data bits; and populating the array with the k data bits according to the re-arranged order of the k data bits.

* * * * *